United States Patent
Teman et al.

(10) Patent No.: US 10,803,920 B2
(45) Date of Patent: Oct. 13, 2020

(54) REFRESH CONTROLLER FOR FIRST-IN FIRST-OUT MEMORIES

(71) Applicant: Birad—Research & Development Company Ltd., Ramat Gan (IL)

(72) Inventors: Adam Teman, Tel Mond (IL); Tzachi Noy, Mazkeret Batya (IL)

(73) Assignee: Birad—Research & Development Company Ltd., Bar Ilan University, Ramat Gan (IL)

(*) Notice: Subject to any disclaimer, the term of this patent is extended or adjusted under 35 U.S.C. 154(b) by 44 days.

(21) Appl. No.: 16/199,448

(22) Filed: Nov. 26, 2018

(65) Prior Publication Data

US 2020/0168270 A1   May 28, 2020

(51) Int. Cl.
*G11C 7/00* (2006.01)
*G11C 11/406* (2006.01)
*G06F 5/06* (2006.01)

(52) U.S. Cl.
CPC .......... *G11C 11/40622* (2013.01); *G06F 5/06* (2013.01)

(58) Field of Classification Search
CPC .............................. G11C 11/40622; G06F 5/06
USPC .................................................. 365/222, 221
See application file for complete search history.

(56) References Cited

U.S. PATENT DOCUMENTS

| | | | | |
|---|---|---|---|---|
| 5,122,988 A | * | 6/1992 | Graeve | G01R 31/31919 365/219 |
| 6,366,156 B1 | * | 4/2002 | Narendra | G05F 3/205 327/534 |
| 6,392,950 B2 | * | 5/2002 | Ayukawa | G11C 11/4076 365/230.03 |
| 6,625,077 B2 | * | 9/2003 | Chen | G06F 13/1636 365/222 |
| 7,797,511 B2 | * | 9/2010 | Vogelsang | G11C 11/406 365/222 |
| 2003/0072206 A1 | * | 4/2003 | Chen | G06F 13/1636 365/222 |
| 2013/0279283 A1 | * | 10/2013 | Seo | G11C 11/40611 365/222 |

* cited by examiner

*Primary Examiner* — Viet Q Nguyen
(74) *Attorney, Agent, or Firm* — Dekel Patent Ltd.; David Klein

(57) ABSTRACT

A method of operating a first-in-first-out memory, called a FIFO, includes performing write and read operations of data with a FIFO. The FIFO has a size fifo_size and a maximum retention time. Once a datum is written to the FIFO, there is a limit of fifo_size-1 write operations before the datum becomes invalid and there is a limit of fifo_size-1 read operations before the datum is read, and the data is refreshed before reaching the maximum retention time. During the refreshing, the FIFO is available for further write and read operations.

8 Claims, 3 Drawing Sheets

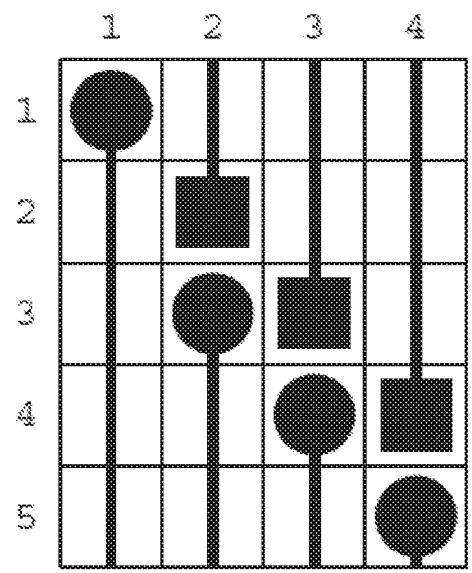
FIG. 3
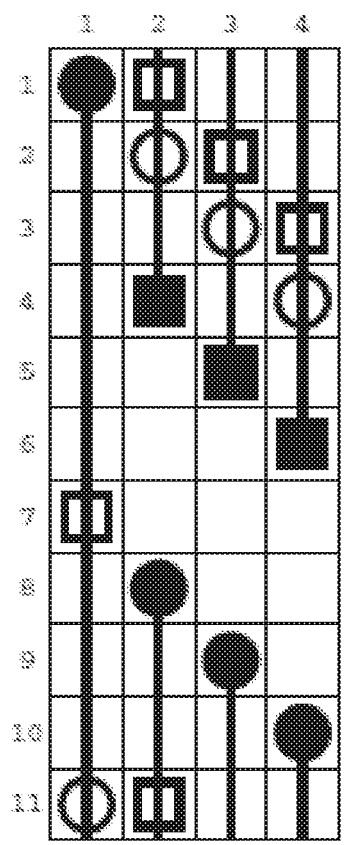 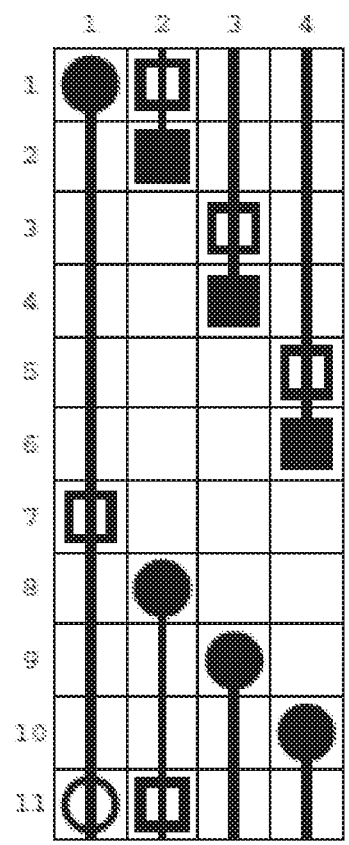
FIG. 4A  FIG. 4B

REFRESH CONTROLLER FOR FIRST-IN FIRST-OUT MEMORIES

FIELD OF THE INVENTION

The present invention relates generally to first-in first-out (FIFO) memories, and particular to a refresh method and controller for FIFO.

BACKGROUND OF THE INVENTION

First-in first-out (FIFO) queues are widely used in digital design, and can be found in any type of application, from networking and storage to multimedia and AI applications [1]-[4]. While queuing theory and network calculus methods are applied to find the minimal size to support all scenarios, in many cases the FIFO size required to support extreme cases is big, while most of the time it is not fully utilized [5], which results in area and power penalties.

Small FIFOs are usually implemented using flip-flops, but as FIFOs get bigger, the common practice is to use static random access memories (SRAMs), because they consume less area per bit. In both implementations area is proportional to the FIFO size, because an extra bit that needs to be stored requires an extra storage element to store it. In both flip-flops and SRAM implementations power is also correlated to FIFO size, because these storage elements consume power regardless of the validity of the data they store.

Embedded DRAM (eDRAM—embedded dynamic random access memory) consumes less area and can consume less power than same size SRAM [6]. However, eDRAM requires periodic refresh operations in order to retain the data. During the refresh cycle the memory is not available for the system to use. This drawback has caused designers to avoid eDRAMs and keep using the costly SRAMs. There are prior art cases where eDRAM can be used as an SRAM alternative [1], [7]-[9]. The prior art eliminates the refresh mechanism from buffers that keep the data for periods shorter than the memory's retention time.

SUMMARY OF THE INVENTION

The present invention provides a novel method for replacing SRAM with embedded DRAM in a FIFO, and in particular, with gain-cell embedded DRAM (GC-eDRAM). The refresh mechanism is not eliminated and the period for which the data is stored in the FIFO is not limited. The FIFO according to the present invention is functionally indistinguishable from an SRAM based FIFO.

Implementation of a FIFO buffer using high-density storage cells, such as DRAM, eDRAM, GC-eDRAM leads to significant area savings.

Application of the refresh algorithm leads to significant power savings, by lowering the dynamic power due to refresh and lowering the leakage power, by using low leakage dynamic storage and only refreshing valid memory words.

The novel refresh controller of the invention is not a trivial refresh. If a trivial refresh algorithm were to be applied, then during refresh, the memory is blocked for external access, causing a stall to the user. In the invention, this does not happen.

It is noted that although the invention is described hereinbelow for use with eDRAM and particularly GC-eDRAM, nevertheless the principles of the inventive refresh method may be used for other implementations of FIFO.

There is provided in accordance with a non-limiting embodiment of the invention, a method of operating a first-in-first-out memory, called a FIFO, including performing write and read operations of data with a FIFO, the FIFO having a size fifo_size and a maximum retention time, wherein once a datum is written to the FIFO, there is a limit of fifo_size-1 write operations before the datum becomes invalid and there is a limit of fifo_size-1 read operations before the datum is read, and refreshing the data before reaching the maximum retention time, while during the refreshing, the FIFO is available for further write and read operations, the refreshing including reading the data from the FIFO and writing the data back to the FIFO.

In accordance with a non-limiting embodiment of the invention the refreshing includes refreshing only data between a HEAD and a TAIL of said FIFO.

In accordance with a non-limiting embodiment of the invention a read pointer is associated with the read operation and a write pointer is associated with the write operation, and the refreshing includes refreshing only data between the read pointer (inclusive) and the write pointer (exclusive), whereas any other data in the FIFO is not refreshed.

In accordance with a non-limiting embodiment of the invention an order in which the data is to be read is known, and the refreshing includes delaying refreshing data which are to be read earlier to be refreshed later within the limit.

In accordance with a non-limiting embodiment of the invention an order in which the data has been written to the FIFO is known, the data ranging from oldest data to newest data, and the refreshing includes first refreshing oldest data, then next oldest data and so forth.

The FIFO has a read port and a write port which may be independent or shared.

In accordance with a non-limiting embodiment of the invention the refreshing is performed so that the maximum retention time is not less than $(3*f\_size-2)$.

Other non-limiting features of the invention may include one or more of the following:

1. The refresh controller employs a counter that indicates the age of the oldest data entry in the FIFO and a refresh pointer that points to the next address to refresh. In addition the refresh control employs a buffer for storing the refresh value between refresh_read and refresh_write operations.

2. The refresh counter is initialized on either or both of the following conditions:
   a. Upon the first write after the FIFO was empty.
   b. Upon the first "refresh_write" operation in a given refresh cycle.

3. When the refresh counter counts to a calculated value, the refresh controller starts to refresh the FIFO.

4. After refresh has started, the refresh operation occurs at address refresh_pointer on any cycle that allows application of a refresh operation. In other words, at a new address, if no external read is being applied, the controller will read the data at refresh_pointer into the refresh buffer, and if the refresh buffer has been filled then in a cycle where no write is being applied, the data in the refresh buffer will be written back to the address at refresh_pointer. Following the refresh_write operation, the refresh pointer will be updated.

5. Initialization of the refresh_pointer, updating strategy and termination condition can be according to other approaches or methods:
   a. Refresh pointer is initialized at read_pointer, incremented after refresh operation and terminates when the entry before the write pointer is refreshed.
   b. The write pointer is stored prior to refresh initialization. Refresh pointer is initialized at read_pointer, incremented after refresh operation and terminates when the entry before the stored write pointer is refreshed.

c. Refresh pointer is initialized at the entry before the write_pointer, decremented after refresh operation and terminates when the entry at the read_pointer is refreshed.

d. Employing a memory with a column-width that is double (or more) the width of the data bus, such that the refresh buffer can store several words and access the memory with a multiple word operation.

BRIEF DESCRIPTION OF THE DRAWINGS

The present invention will be understood and appreciated more fully from the following detailed description taken in conjunction with the drawings in which:

FIG. 3 is a schematic illustration of the number of read and write operations for a valid entry bounded by (fifo_size-1).

FIGS. 4A and 4B are schematic illustrations of fifo-write to refresh-write.

DETAILED DESCRIPTION OF EMBODIMENTS

A FIFO (First In First Out) is a hardware queue, in which new items join the FIFO on one end (tail) and leave when they reach the other (head). In many hardware implementations of FIFOs the items do not move in the queue; instead a FIFO controller keeps track of where the head and tail of the FIFO are. For a FIFO with a dedicated buffer this is usually done by employing a read pointer that points at the next item to be read from the buffer and a write pointer that points at the first available entry to which the next incoming item will be written to. Every time a write operation is performed, the write pointer is incremented, and similarly, the read pointer is incremented after every read operation. Any given buffer has a finite definition of the number of entries it can store, and therefore, the FIFO has a finite size. The maximum number of items that can fit in the FIFO is referred to as fifo_size.

In order to make the FIFO address independent of the physical boundaries of the memory with which it is implemented, circular addressing is applied. In other words, once the write pointer reaches the last physical address of the FIFO memory and an additional entry is written, the write pointer wraps around and starts over from the first address of the memory. If at some point, the write pointer is incremented and points at the same entry as the read pointer, the FIFO is said to be full and no more data can be written before at least one data entry is read. If at some point the read pointer was incremented and points to same entry as the write pointer, the FIFO is said to be empty, and no data can be read until new data is written.

Figure 1:
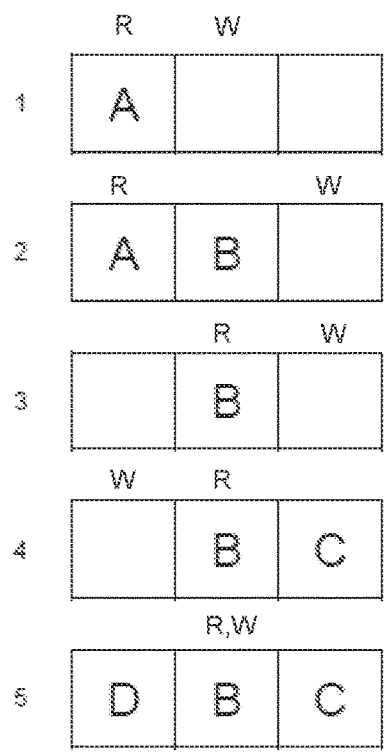
FIG. 1 is a schematic illustration of a read pointer and write pointer mechanism.

A FIFO of size 3 is illustrated in FIG. 1. At first only item A is in the queue, as can be seen on the topmost row. The read pointer is pointing at the location of that item, indicated by the letter R above item A. The write pointer is pointing at the first free location next to it, indicated by the letter W. On the next cycle, item B is written to the empty location previously pointed by the write pointer, and the write pointer moves one location to the right. On the third cycle, item A is read from the FIFO, so the read pointer moves one location to the right. On the fourth cycle, item C is written to the rightmost location and the write pointer wraps around and now points to the leftmost location. On the last cycle item D is written, and the write pointer moves one location to the right, pointing to the same location pointed by the read pointer. This condition indicates that the FIFO is full and no writes are allowed until item B will be read. The items are always read in the order they were written because the read pointer always follows the steps the write pointer has done before.

Figure 2:
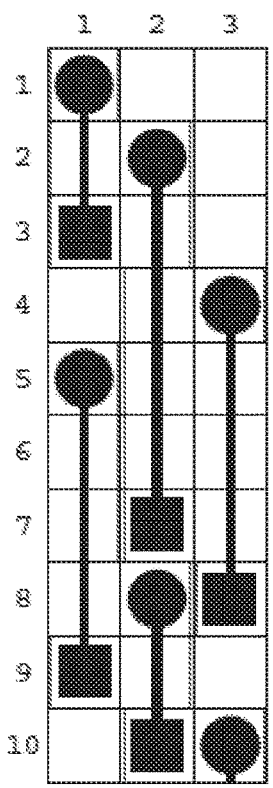
FIG. 2 is a schematic illustration of the FIFO state representation over time.

For the purpose of illustrating the state of the FIFO over time and analyzing the proposed algorithms, a novel representation is illustrated in FIG. 2. This representation is similar to the representation used in FIG. 1, but focuses on the read and write operations rather than the items in each location. Time (in operating cycles) is represented on the vertical axis, starting from the top. The physical addresses of the buffer are represented as separate columns. An empty cell represents an address that holds no valid data. A filled circle represents an entry being written, a line represents an entry holding valid data, and a filled square represents an entry being read. A line on the left side represents the head of the FIFO, and a line on the right represents the tail.

In the example of FIG. 2, a FIFO of size 3 (fifo_size=3) is shown for 10 cycles of operation. The first five cycles in FIG. 2 are equivalent to those in FIG. 1. The item written on the 1st cycle is read on the 3rd. The item written on the 2nd cycle is read on the 7th. On the 5th cycle the head and tail markers are back to back, which means the FIFO is now full and there can be no more writes until the head entry is read. On cycles 8 and 10 one entry is being written, while another is being read. This assumes a two-ported memory implementation, which allows simultaneous read and write operations from different addresses.

The representation shown in FIG. 2 enables clear visual analysis of the FIFO state during any given cycle, including the values of the read pointer and the write pointer, as well as the utilization of the write and read access ports of the memory. For example, looking at cycle 3 in FIG. 2, the entry written to the second memory address is the first entry in the FIFO at that point (i.e., the read pointer is pointing at it). The read pointer will always be pointing to the address with the highest (earliest) write (circle) that has not yet been read (square). The write pointer will always be pointing to the address to the right of the lowest (latest) write (circle). The number of valid entries in the FIFO is equal to the number of non-empty squares in the row that is associated with that cycle. So during cycle 5, there are two valid entries (addresses 2 and 3), and during cycle 8, the FIFO is full. This representation will be used throughout the description to help explain the considerations for each state and the algorithmic approaches that address them.

Embedded DRAM

Broadly speaking, volatile embedded memories can be divided into two main categories: SRAM, and eDRAM. SRAM is currently the dominant technology and uses a cross-coupled inverter pair to retain the stored data statically as long as a power supply voltage is provided. eDRAM technology requires fewer devices, as it stores data in the form of electric charge on a capacitor; unfortunately, the stored data is compromised due to leakage currents, which results in the requirement for a periodic refresh operation. The time limit for data retention is called retention time, such that a memory word must be refreshed at most retention time after it was written to ensure data validity.

eDRAM can be further divided into two sub-categories: 1) conventional, one-transistor, one-capacitor (1T-1C)

eDRAMs, whose basic bitcell is built from a special, high-density, 3D capacitor and a single access transistor, and 2) gain-cell embedded DRAM (GC-eDRAM), whose basic bitcell is built from 2-4 MOS transistors. Conventional 1T-1C eDRAMs typically require special process options to build high-density stacked or trench capacitors, and are therefore, both costly and not always compatible with the widespread standard digital CMOS technology. Such process options are only available at an extra manufacturing cost and are not readily available for all technology processes.

As opposed to this, GC-eDRAMs are fully compatible with baseline digital CMOS technologies, and can easily be integrated into any system-on-chip (SoC) at no extra cost. In addition, the GC-eDRAM bitcell is two-ported by nature, so it inherently addresses the requirement of many FIFOs for concurrent read and write operations.

Another advantage is that GC-eDRAM is both smaller and consumes less power than an equivalent SRAM [6]. The main drawback of GC-eDRAM (and eDRAM in general) compared to SRAM is the need of periodic refresh operations. In addition to the associated power overhead, refresh operations cause the memory to be unavailable to the system some fraction of the time. However, in the present invention, this problem is solved with a refresh controller such that an eDRAM based FIFO is indistinguishable from an SRAM based one.

Fifo Features Exploitable by the Refresh Controller

Limited Number of Writes and Reads

A FIFO, by nature, limits the number of reads and writes the user can do from the moment a specific entry was written until the moment it is read. Specifically, for a FIFO of size fifo_size, once a specific entry is written, there can be at most fifo_size-1 writes before this specific entry has to be read (or else the FIFO enters the full state). Similarly, once an entry is written, there can only be fifo_size-1 reads before it being read. This bounding limit is illustrated in FIG. 3. The number of reads and writes while entry #0 is valid are limited, because the next entry to be read after 3 reads is entry #0 and no more than 3 write operations can occur before the FIFO gets full. The order and timing of reads and writes might be different than what is shown in FIG. 3, but in any case, the nature of the FIFO limits the number of reads and writes. The FIFO refresh controller of the present invention exploits this feature to guarantee refresh of every entry on time without being noticed, something that is not possible for the general random access case.

Items which are Refreshed and which are not Refreshed

For the general memory case, there is no way for the controller to tell which words will be read and which are no longer needed (i.e., will never be read). Therefore, all words in a general purpose eDRAM based memory need to be periodically refreshed, despite the fact that some of them will be overwritten without being read first.

In contrast, in a FIFO, all items between the read pointer (inclusive) and the write pointer (exclusive) will be read, and therefore, must be refreshed. Thus, in the FIFO, all other entries will not be read, and there is no need to refresh them. Exploiting this feature, in the present invention, all other entries are not refreshed, which allows the refresh controller to save power according to utilization of the FIFO. While in SRAM most of the power consumption comes from the static leakage of the entire array and holding one entry in the FIFO consumes much power. In contrast, in DRAM, much power can be saved according to the number of entries currently in the FIFO.

In many cases, the size of the FIFO is selected such that the system is guaranteed to work properly in extreme scenarios. However, these scenarios rarely occur, such that in the average case, the FIFO is far from being full. This means that a large array can be used to support the extreme cases, with lesser penalty in power for the common case.

Strict Ordering

Another feature is the ordered fashion of writes and reads in a FIFO. In the general case, the entries are written and read in a random order, so age of each entry is unknown, unless some timestamp mechanism is used. In a FIFO, on the other hand, the entries are known to be written in an ordered fashion, so although the exact age is unknown, the age relations between the entries are known, including which entry is the oldest.

The ordered fashion of reads may also be exploited in the invention. Because a FIFO is functionally a write-once-read-once memory, there is no gain in refreshing entries that will be read before they expire. The controller cannot guess when any entry will be read, but it knows the order in which the entries are going to be read. Using this information, the refresh controller schedules the refresh of entries, which are most likely to be read earlier, to be refreshed as late as possible. This can lead to power savings, by not refreshing the entries that were indeed read before their retention time passed.

When the FIFO is too big to be implemented using a single array, the ordered fashion of writes and reads leads to another advantage. If two arrays are interleaved, such that odd and even entries are stored in different arrays—each array will have to serve the user at most every other cycle, leaving 50% of the memory bandwidth for refresh. This will also work for more than two arrays, as long as the arrays are interleaved. This is guaranteed by reads and writes being well ordered in a FIFO. In the general case of a memory composed of smaller arrays, no ordering can guarantee this, because in the worst case, accesses can repeatedly be applied to the same array.

Refresh Controller of the Invention

Adding a refresh controller adds two new states to the lifecycle of an item. Whereas the traditional FIFO diagram of FIG. 2 only assumed a single write and a single read during the lifetime of an item, a refresh controller may read and write a given entry multiple times to avoid data corruption. We will refer to these states as refresh-read and refresh-write, and for differentiation, we will hereafter refer to normal reads and writes done by the FIFO as fifo-read and fifo-write. We will represent a refresh-read operation with an empty square and a refresh-write operation with an empty circle.

FIGS. 4A and 4B illustrate examples of a FIFO undergoing refresh operations. At any given point of time, only one read operation can occur, either fifo-read or refresh-read. Similarly, only one write operation can occur during a given cycle, either fifo-write or refresh-write. This translates to at most one circle and one square (both either filled or empty) per row in the visual representations. These visualizations will be used to introduce and demonstrate approaches to refresh controller design hereafter.

Feasibility of Refresh Controller Design

The main challenge of the refresh controller is to devise a refresh scheme that guarantees that all data entries are refreshed on time, never expiring, while at the same time, not interfering with the normal operations requested by the user to read from and write to the FIFO. This is a challenge. For example, if fifo_size (given in units of the number of entries) is larger than retention time (given in units of clock cycles), and the user writes for fifo_size consecutive cycles, then without interrupting the user access, the first entry will expire after retention time, since the memory will be constantly undergoing write operations, thereby blocking refresh.

The above example is basically irrelevant, since in the case of fifo_size retention time, the FIFO would have to undergo constant refresh operations just to retain all the data written to it, blocking any user operations. More practically, the case of the example can be generalized to show that any refresh scheme has an upper limit on fifo_size for a given retention time. The pair (S; T) is said to be feasible for a specific refresh scheme if the scheme guarantees that no valid data will expire if used on a FIFO with parameters fifo_size=S and retention time=T. Let F(T) be the maximum fifo_size for a given retention time, T, such that (F(T); T) is feasible. F(T) is a non-decreasing function in T, since a FIFO with higher retention time is at least as good. Similarly, let R(S) be the minimal retention time for a given fifo_size, S, such that (S; R(S)) is feasible. R(S) is a non-decreasing function in S, since a smaller FIFO is at least as good from a retention time perspective.

The following subsections will introduce the basic approaches to FIFO refresh and analyze their feasibility, followed by the method in accordance with an embodiment of the invention.

Timestamping

To initiate the discussion about refresh controller design, we can assume the most naive approach, which would be to keep a timestamp for every entry, so that the controller can track exactly when each entry needs to be refreshed. This would provide enough information to devise the best possible refresh scheduling to ensure data integrity, while eliminating unnecessary refresh operations. However, the overhead for this approach undermines the benefits of using eDRAM. First, keeping a timestamp per entry comes with the cost of storing additional bits per entry, resulting in a very large area overhead. Second, calculating the best time for the next refresh requires the knowledge of the age of all valid entries. Therefore, the timestamps must be stored in statically accessed registers, rather than in a memory, such that the area overhead is even larger. Finally, this calculation is quite costly in terms of logic, resulting in even more area and power waste. To summarize, it is clear that implementing this logic does not scale well for FIFOs with more than a few entries.

Linear Refresh

If one does not want to track the age of each entry, the next step would be to track only the age of the oldest. As long as all entries are refreshed before the oldest expires, data integrity is guaranteed. Due to the ordered writes in a FIFO, entry ages decrease as one moves away from read pointer, so one knows the oldest is pointed to by the read pointer, the youngest (least old) is the one just before the write pointer, and entries in between are ordered by age.

Refreshing may be started from the oldest (pointed to by the read pointer), followed by refreshing each entry, entry by entry, towards the write pointer until all entries are refreshed. During this process, the oldest is no longer the one pointed to by the read pointer, but once this refresh cycle ends, that is, the refresh pointer reaches the write pointer, the age of the entries forms a decreasing sequence once again. By keeping the age of the entries decreasing, the older entries are always refreshed first.

From the definition of R(S) it is clear that the pair (S; R(S)-1) is infeasible, but (S; R(S)) is. This means that there exists a pattern of fifo-read and fifo-write operations for which the refresh controller will fail for retention time=R(S)-1, but no pattern will cause it to fail for retention time=R(S). The maximum time from any write to the following refresh-write determines R(S) for the scheme. In many cases, the controller can delay refresh operations in order to save power, but for the sake of calculating R(S), one can assume any refresh-read is performed as early as can be, because refresh operations are ordered and a refresh-read done earlier cannot delay following operations. Similarly, one can assume any refresh-write to other entries is also done as early as possible.

We will first find the maximum number of cycles from the fifo-write of an entry until its corresponding refresh-read. Fifo-reads are ordered from oldest to newest, and in the linear refresh scheme, so are refresh-reads. This means that the last entry to be written is the last to be refresh-read and also the last to be fifo-read. Hence, from the moment an entry was written until being refresh-read, there can be at most (fifo_size-1) refresh-read operations and (fifo_size-1) fifo-read operations. This is demonstrated in the top parts of FIGS. 4A and 4B.

In FIG. 4A, a worst-case situation is presented by writing an entry (#0) and subsequently serially refreshing and then fifo-reading all the other entries in the FIFO. Therefore, the earliest cycle that a refresh-read can be applied to the entry is in cycle #6, or 2(fifo_size-1) cycles later with fifo-size=4. Similarly, in FIG. 4B, after writing entry #0, a refresh-read is applied to the next entry, immediately followed by fifo-read, and the same sequence is applied to the rest of the entries. Again, the first available slot for applying a refresh-read to entry #0 is cycle #6. To summarize, an entry fifo-written at cycle # n will be refresh-read no later than cycle #(n+2(fifo_size-1)).

A point of note is the maximum time from a refresh-read to a refresh-write operation. Note that the refresh controller is assumed to have a single refresh register, and therefore, no additional refresh-reads or refresh-writes can be applied to other entries, after a refresh-read operation. In addition, the refresh operation is assumed to be applied to the oldest entry in the FIFO first, and so any fifo-read operation will invalidate the entry under refresh and make the current refresh operation obsolete. Hence, the only operation that can be applied in-between a refresh-read and refresh-write is a fifo-write operation. This is demonstrated in the bottom parts of FIGS. 4A and 4B. The figures show that the latest (worstcase) time that a refresh-write can be delayed is until cycle #10, or fifo_size cycles after its corresponding refresh-read operation (following (fifo_size-1) fifo-write operations). To summarize, an entry refresh-read at cycle # n will be refresh-written no later than cycle #(n+fifo_size). Combining the two observations, we conclude that an entry fifo-written at cycle # n will be refresh-written no later than cycle #(n+3fifo_size-2).

Note how in the first part, from fifo-write to refresh-read, the first refresh-read occurs on the same cycle as the fifo-write, while in the second part, from refresh-read to refresh-write, there is no concurrent operation with the refresh-read. This is due to the fact that the refresh operations are timed by the controller but not the FIFO operations. This means the controller can time its operations early, in order to meet the retention time criteria. The FIFO operations, on the other hand, can occur at any time, and for the sake of this calculation are timed as to delay the refresh operations as much as possible. We have calculated the time from fifo-write to refreshwrite but the same calculation applies to the time between consecutive refresh-writes. Note that the last row in both FIGS. 4A and 4B is the same as the first row except for the fifo-write replaced by refresh-write. The pattern on cycles 1 through 10 can be repeated on cycles 11 through 20, so the entry first refresh-written on cycle 10 will next be refreshed on cycle 20.

Our calculations above apply to all entries of the FIFO at all times, so it proves the linear refresh scheme guarantees no data loss with R(S)=3S-2.

Our analysis so far was for a FIFO that is refreshing whenever it could. When timing is relaxed, it is advantageous to delay the refresh process in order to save power. We keep track of A0, the age of the oldest entry, to make sure it is refreshed on time, but we have to make sure all other entries are refreshed on time as well. Because we do not keep record of the age of other entries, we have to assume the worst-case, which would occur if all entries were written consecutively. Therefore, an entry in the nth position from the oldest is assumed to be (A0-n) cycles old. We will assume, without loss of generality, that the oldest is entry #0, so that the age of the nth entry is (A0-n). Entries are refreshed by age, so if the nth entry was refreshed at cycle # C, entry (n-1) was refreshed prior to cycle # C. So, assuming the nth entry is (A0-n) cycles old, if the newest was refreshed on time, all the older entries were refreshed on time as well.

Figure 5A:
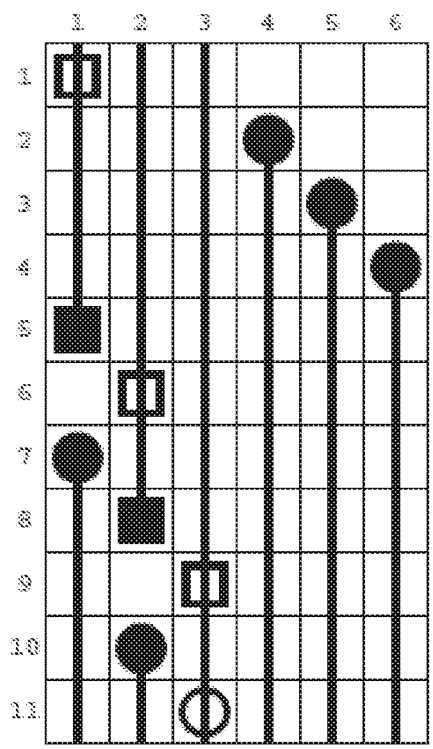
FIGS. 5A and 5B are schematic illustrations of a refresh cycle.

We now want to find the maximum number of cycles it takes for a full refresh cycle to finish. The cycle begins with V valid entries and ends when all V were refreshed. FIG. 5A shows one example of fifo_size=6 and V=3. From the moment the first entry is refresh-read there can be at most (fifo_size-1) fifo-writes, (V-1) fifo-reads, and (V-1) refresh-reads before the Vth entry can be refresh-written. So a refresh-cycle starting at cycle # n will end no later than cycle #(n+fifo_size+2V-2). In the example, this comes out to be cycle #10, as can be observed in FIG. 5A.

Figure 5B:
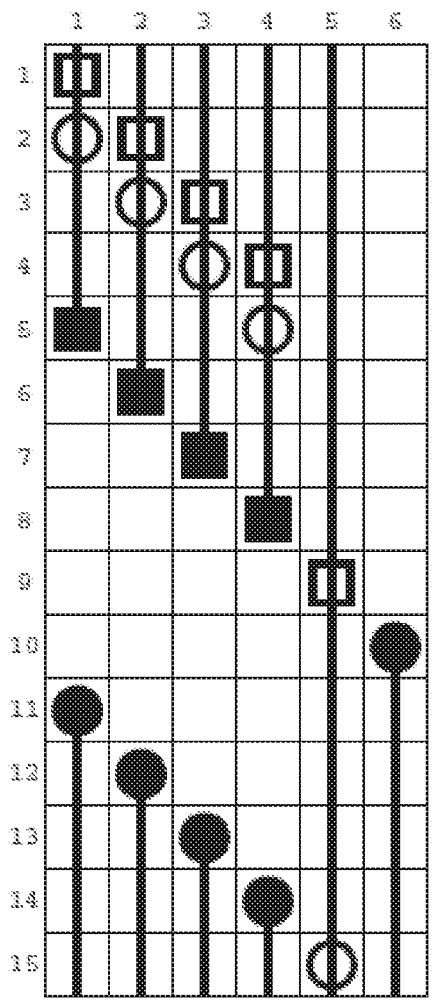

Another example is provided in FIG. 5B, this time with fifo_size=6 and V=5. The two extra entries add 4 cycles to the maximum time in accordance with the formula. Note that, as mentioned above, the refresh-write cycles are not counted, except for the last one, because they are always in parallel to some read operation. Also note that the formula presented for R(S) earlier is a special case of this formula, where V=fifo_size. R(S) is the maximum time an entry will be delayed from write to refresh-write if the FIFO was filled in between. Hence, V=fifo_size, and was written at the same cycle a refresh cycle began.

A drawback of this approach is the refresh cycle is not guaranteed to ever end. In the worst case, for every refreshed entry, the user might be reading one entry and writing one entry, so that the refresh pointer keeps chasing the write pointer indefinitely. Data integrity is still guaranteed but it might result in twice the power consumption in the worst case because every entry is being written and read twice, although most entries spent very little time in the FIFO.

Linear Refresh with Stored Write Pointer

In another embodiment, the write pointer is stored on the first write of a refresh cycle, and all entries are refreshed from the read pointer to the stored write pointer. This is a viable solution because every entry written after the first write is newer and will not expire until the next cycle. This avoids endless refresh cycles at the cost of storing an extra pointer.

In the previous approach, entry ages formed a decreasing sequence between refresh cycles; in this embodiment, this is no longer the case. Once a refresh cycle ends in this method, i.e., the refresh pointer reaches the stored write pointer, two decreasing sequences are obtained, similar to the timestamp approach. This means that the second oldest entry might not be the one next to read pointer, but anywhere between read pointer and write pointer. This means the refresh cycle must start earlier (relative to previous algorithm) in order to guarantee all entries are refreshed on time.

Reverse Refresh Approach

The two linear refresh-cycle based algorithms described above resulted in refresh pointer moving away from read pointer and towards write pointer, which makes sense as long as the entries are ordered by age, but this assumption no longer holds for the last method described. As mentioned above, in the last method, the refresh cycle has to start earlier, as the next oldest entry can be anywhere between the pointers. But in that case starting from the read pointer is actually a disadvantage, because it is the most likely entry to be read during the refresh window. If all entries are to be refreshed during some time window, another embodiment uses a reverse refresh approach, starting from write pointer-1 and moving towards read pointer, saving the power of entries that are read before refresh pointer gets to them.

Reverse refresh has another advantage. All refresh cycle based algorithms have to start at a time when it can guarantee completion on time regardless of user's read and write operations. For the forward refresh algorithms described above, every cycle the user reads is potentially a waste because the controller cannot read the next entry to be refreshed, and every cycle the user writes is potentially a waste because the controller cannot write. In contrast, in the backward refresh approach, a cycle the user reads is not wasted, because it means fewer entries remain for refreshing. Thus, the backward refresh approach not only saves the power of reading and writing that entry, the refresh cycle can start later, hence saving power in the long term.

REFERENCES

[1] K. Lee, S.-J. Lee, and H.-J. Yoo, "A practical method to use eDRAM in the shared bus packet switch," in Global Telecommunications Conference, 2002. GLOBECOM '02. IEEE, vol. 3, pp. 2303-2307 vol. 3, November 2002.

[2] S. Sariga and C. Nandagopal, "An area efficient network on chip architecture using high performance pipelines fifo technique," in 2017 IEEE International Conference on Electrical, Instrumentation and Communication Engineering (ICEICE), pp. 1-5, April 2017.

[3] F. Hassen and L. Mhamdi, "A scalable multi-stage packet-switch for data center networks," Journal of Communications and Networks, vol. 19, pp. 65-79, February 2017.

[4] W. Choi, K. Choi, and J. Park, "Low cost convolutional neural network accelerator based on bi-directional filtering and bit-width reduction," IEEE Access, vol. 6, pp. 14734-14746, 2018.

[5] C. Soviani and S. A. Edwards, "Fifo sizing for high-performance pipelines," 2007.

[6] P. Meinerzhagen, A. Teman, R. Giterman, N. Edri, A. Burg, and A. Fish, Gain-Cell Embedded DRAMs for Low-Power VLSI Systems-on-Chip. Springer Publishing Company, Incorporated, 1st ed., 2017.

[7] G. Kang, W. Choi, and J. Park, "Embedded dram-based memory customization for low-cost fft processor design," IEEE Transactions on Very Large Scale Integration (VLSI) Systems, vol. 25, pp. 3484-3494, December 2017.

[8] Y. S. Park, D. Blaauw, D. Sylvester, and Z. Zhang, "Low-power highthroughput LDPC decoder using non-refresh embedded DRAM," IEEE Journal of Solid-State Circuits, vol. 49, pp. 783-794, March 2014.

[9] W. Choi, G. Kang, and J. Park, "A refresh-less edram macro with embedded voltage reference and selective read for an area and power efficient viterbi decoder," IEEE Journal of Solid-State Circuits, vol. 50, pp. 2451-2462, October 2015.

What is claimed is:

1. A method of operating a first-in-first-out memory, called a FIFO, comprising:

performing write and read operations of data with a FIFO, said FIFO having a size fifo_size and a maximum retention time which is defined as a time that all of said data remains valid without being refreshed, wherein once a datum of said data is written to said FIFO, there is a limit of fifo_size-1 write operations before said datum becomes invalid and there is a limit of fifo_size-1 read operations before said datum is read; and refreshing said data before reaching said maximum retention time, while during said refreshing, said FIFO is available for further write and read operations, said refreshing comprising reading said data from the FIFO and writing said data back to said FIFO.

2. The method according to claim 1, wherein said refreshing comprises refreshing only data between a HEAD and a TAIL of said FIFO, said HEAD and said TAIL being opposite ends of a hardware queue.

3. The method according to claim 1, wherein a read pointer is associated with the read operation and a write pointer is associated with the write operation, and the refreshing comprises refreshing only data from and including an address where said read pointer is located up to but not including an address wherein said write pointer is located, whereas any other data in said FIFO is not refreshed.

4. The method according to claim 1, wherein an order in which all of the data is to be read is known, and the refreshing comprises delaying refreshing portions of said data which are to be read earlier to be refreshed later within said limit.

5. The method according to claim 1, wherein an order in which the data has been written to said FIFO is known, said data ranging from an oldest datum to a next oldest datum up to a newest datum, and the refreshing comprises first refreshing said oldest datum, then said next oldest datum and so forth.

6. The method according to claim 1, wherein said FIFO has a read port and a write port which are independent.

7. The method according to claim 1, wherein said FIFO has a read port and a write port which are shared.

8. The method according to claim 1, wherein said refreshing is performed so that said maximum retention time is not less than (3*fifo_size-2).

* * * * *